(12) United States Patent
Kubota et al.

(10) Patent No.: US 7,456,548 B2
(45) Date of Patent: Nov. 25, 2008

(54) PIEZOELECTRIC ELEMENT, PIEZOELECTRIC ACTUATOR, AND INK JET RECORDING HEAD

(75) Inventors: Makoto Kubota, Tokyo (JP); Motokazu Kobayashi, Yokohama (JP); Keiko Abe, Kawasaki (JP); Fumio Uchida, Daito (JP); Kenji Maeda, Nakatsugawa (JP); Chiemi Shimizu, Hirakata (JP)

(73) Assignees: Canon Kabushiki Kaisha, Tokyo (JP); Fuji Chemical Co, Ltd., Osaka (JP)

( * ) Notice: Subject to any disclaimer, the term of this patent is extended or adjusted under 35 U.S.C. 154(b) by 49 days.

(21) Appl. No.: 11/741,895

(22) Filed: Apr. 30, 2007

(65) Prior Publication Data

US 2007/0262678 A1 Nov. 15, 2007

(30) Foreign Application Priority Data

May 9, 2006 (JP) .............................. 2006-130295

(51) Int. Cl.
*H01L 41/08* (2006.01)

(52) U.S. Cl. .................. 310/324; 310/328; 310/358

(58) Field of Classification Search ................. 310/324, 310/328, 358, 359
See application file for complete search history.

(56) References Cited

U.S. PATENT DOCUMENTS

| | | | |
|---|---|---|---|
| 5,265,315 A | 11/1993 | Hoisington et al. | |
| 5,446,484 A | 8/1995 | Hoisington et al. | |
| 5,500,988 A | 3/1996 | Moynihan et al. | |
| 5,625,529 A | 4/1997 | Lee et al. | |
| 5,691,752 A | 11/1997 | Moynihan et al. | |
| 5,694,156 A | 12/1997 | Hoisington et al. | |
| 6,203,608 B1 | 3/2001 | Sun et al. | |
| 6,374,482 B1 | 4/2002 | Mihara et al. | 29/611 |
| 6,513,911 B1 | 2/2003 | Ozaki et al. | 347/58 |
| 7,187,024 B2 | 3/2007 | Kobayashi et al. | 257/295 |
| 7,205,706 B2 * | 4/2007 | Kadotani et al. | 310/365 |
| 2001/0016229 A1 | 8/2001 | Sun et al. | |
| 2001/0043454 A1 * | 11/2001 | Yoshii et al. | 361/321.2 |
| 2005/0082943 A1 | 4/2005 | Kubota et al. | 310/311 |
| 2006/0043841 A1 * | 3/2006 | Kadotani et al. | 310/328 |
| 2007/0001553 A1 * | 1/2007 | Kawada et al. | 310/358 |
| 2007/0024162 A1 * | 2/2007 | Shibata et al. | 310/358 |

(Continued)

FOREIGN PATENT DOCUMENTS

JP 5-190798 7/1993

(Continued)

OTHER PUBLICATIONS

Vasant Kumar, et al., "Lead Zirconate Titanate Films by Rapid Thermal Processing", *Applied Physics Letters* 58(11), Mar. 18, 1991, pp. 1161-1163.

*Primary Examiner*—Mark Budd
(74) *Attorney, Agent, or Firm*—Fitzpatrick, Cella, Harper & Scinto

(57) ABSTRACT

A piezoelectric element having a piezoelectric film and one pair of electrodes being in contact with the piezoelectric film on a substrate, wherein the piezoelectric film has a structure in which a lead-containing piezoelectric film and a lead-free piezoelectric film are laminated, and in the piezoelectric film, a layer furthest from the substrate and a layer closest to the substrate are lead-free piezoelectric films.

10 Claims, 3 Drawing Sheets

U.S. PATENT DOCUMENTS

2007/0097182 A1    5/2007    Kubota et al. ................ 347/70

FOREIGN PATENT DOCUMENTS

| JP | 5-504740 | 7/1993 |
| JP | 6-21337 | 1/1994 |
| JP | 8-273436 | 10/1996 |
| JP | 10-335596 | 12/1998 |
| JP | 11-26703 | 1/1999 |
| JP | 11-292626 | 10/1999 |
| JP | 2004-186574 | 7/2004 |

* cited by examiner

PIEZOELECTRIC ELEMENT, PIEZOELECTRIC ACTUATOR, AND INK JET RECORDING HEAD

BACKGROUND OF THE INVENTION

1. Field of the Invention

The present invention relates to a piezoelectric element, a piezoelectric actuator using the same, and an ink jet recording head.

2. Description of the Related Art

A piezoelectric element is generally constituted by lower and upper electrodes and a ferroelectric or paraelectric crystallized piezoelectric ceramics sandwiched by these electrodes. As the piezoelectric ceramics, a lead-containing piezoelectric ceramics such as lead zirconium titanate (to be referred to as "PZT" hereinafter) or a "PLZT-type" ceramics obtained by adding lanthanum to the PZT is generally used. For example, a ferroelectric using PZT is described in Applied Physics Letters, Vol. 58, No. 11, pp. 1161 to 1163, 1991.

As an application of a piezoelectric element using a film-like piezoelectric, an ink jet recording head is known. In order for a piezoelectric film used in this application to exhibit a sufficient electromechanical transducing function (pressure which encourages displacement), a film thickness of about 1 µm to 25 µm is necessary.

As a method of manufacturing the piezoelectric film, a sputtering method, a metal-organic chemical vapor deposition method (to be referred to as an MOCVD method), a chemical solution deposition method (to be referred to as a CSD method), and the like are known. The CSD method is a method which coats a solution or dispersion liquid containing metal components serving as a precursor of piezoelectric on a substrate, heats the coating film to form a metal oxide film, and calcines and crystallizes the metal oxide at a crystallizing temperature or more to form a piezoelectric film.

In general, when the metal component contained in coating liquid is a hydrolytic metallic compound, the method is called a sol-gel method. When the metal component is a thermally decomposable metal compound, the method is called a metal-organic decomposition method (to be referred to as an MOD method). In the present invention, the sol-gel method, the MOD method, and a method obtained by mixing these methods are called a "CSD" method. The CSD method has an advantage that a piezoelectric film can be easily formed.

An ink jet recording head using the PZT piezoelectric element formed by the CSD method is disclosed. For example, U.S. Pat. No. 5,265,315 and Japanese Patent Application Laid-Open No. H05-504740 disclose a method which laminates a PZT piezoelectric film having a thickness of 2 to 10 µm on a lower electrode by the CSD method and performs predetermined steps to the PZT piezoelectric film to form an ink jet recording head.

However, a conventional PZT piezoelectric element has the following problems on fatigue characteristics. When domain inversion is repeated to drive the PZT piezoelectric element, oxygen in a PZT near an electrode is short due to diffusion, a magnitude of displacement becomes small, and a leakage current increases.

In the field of a ferroelectric capacitor having a structure similar to that of the PZT piezoelectric element, in order to solve the problems, the following device is made. That is, another element is doped in a part or whole of the PZT to obtain a composition different from the PZT, thereby improving the fatigue characteristics (see Japanese Patent Application Laid-Open No. H05-190798, Japanese Patent Application Laid-Open No. H08-273436, Japanese Patent Application Laid-Open No. H10-335596, Japanese Patent Application Laid-Open No. H11-026703, and Japanese Patent Application Laid-Open No. H11-292626).

Even in the PZT piezoelectric element, the device described in the Patent Documents is applied to improve the fatigue characteristics. However, since a material which has no piezoelectricity is incorporated, the electromechanical transducing function of the entire element is deteriorated.

On the other hand, in Japanese Patent Application Laid-Open No. H06-021337, the following device is made. That is, a lead content of PZT near an electrode of a ferroelectric capacitor is purposely made excessive to improve fatigue characteristics. When this device is applied to a PZT piezoelectric element, it is expected that the electromechanical transducing function is not so deteriorated. However, an excessive lead component near the surface of the element is easily evaporated and separated. This is not preferable in terms of safety, health and environmental conservation.

In addition, Japanese Patent Application Laid-Open No. 2004-186574 discloses a piezoelectric film having a simple laminate structure constituted by a lead-containing piezoelectric film and a lead-free piezoelectric film.

SUMMARY OF THE INVENTION

The present invention has been made in consideration of an actual state of the conventional technique, and its object is to provide a piezoelectric element which is excellent in fatigue characteristics and piezoelectric characteristics, a piezoelectric actuator using the piezoelectric element, and an ink jet recording head using the piezoelectric element.

A piezoelectric according to the present invention which solves the above problem is a piezoelectric element having a piezoelectric film and one pair of electrodes being in contact with the piezoelectric film, the piezoelectric film has a structure obtained by laminating a lead-containing piezoelectric film and a read-free piezoelectric film, a layer furthest from the substrate and a layer closest to the substrate in the piezoelectric film are lead-free piezoelectric films.

According to the present invention, a piezoelectric element in which a displacement increases and deterioration of a displacement amount decreases in continuous driving can be provided. According to the present invention, a piezoelectric actuator which can easily control a displacement amount can be provided. Furthermore, according to the present invention, a recording head which is suitable for long-time driving can be provided.

Further features of the present invention will become apparent from the following description of exemplary embodiments with reference to the attached drawings.

DESCRIPTION OF THE EMBODIMENTS

Embodiments for carrying out the invention will be described below.

Figure 1:
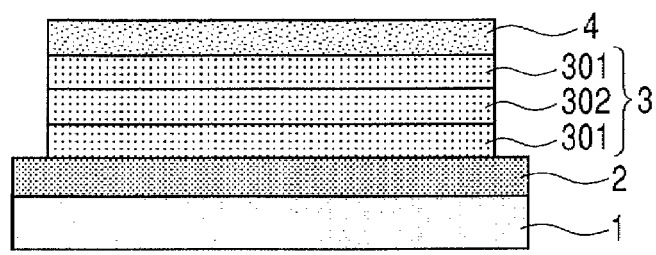
FIG. 1 is a vertically sectional view showing an example of an embodiment of a piezoelectric element according to the present invention.

FIG. 1 is a vertical sectional view of one example of an embodiment of a piezoelectric element according to the present invention. In FIG. 1, reference numeral 1 denotes a substrate; 2, a lower electrode; 3, a piezoelectric film; and 4, an upper electrode. Reference numeral 301 denotes a lead-free piezoelectric film (to be also referred to as a "lead-free piezoelectric thin film" hereinafter) constituting the piezoelectric film 3. Reference numeral 302 denotes a lead-containing piezoelectric film (to be also referred to as a lead-containing piezoelectric thin film" hereinafter) constituting the piezoelectric film 3.

The material of the substrate 1 is not limited to a specific material. However, a material which is not transformed and melted in a heating step when the lower electrode 2, the piezoelectric film 3, and the upper electrode 4 are formed is preferably used. The heating step is generally performed at the temperature of 800° C. or lower. When an ink jet recording head according to the present invention is manufactured by using the piezoelectric element according to the present invention, the substrate 1 may also serve as a pressure chamber substrate to form a pressure chamber. For example, for this purpose, a semiconductor substrate consisting of silicon (Si) and tungsten (W) or a heat-resistance stainless steel (SUS) substrate is preferably used. However, a ceramic substrate of zirconia, alumina, or silica may be used. Also, a substrate consisting of a material obtained by combining the plurality of materials may be used, or a substrate having a multi-layered configuration obtained by laminating these materials may be used. A substrate obtained by laminating these materials and a metal layer consisting of platinum or palladium may be used.

The lower electrode 2 and the upper electrode 4 are constituted by conductive layers each having a layer thickness of about 5 to 2000 nm. The materials of the electrodes are not limited to specific materials. Materials generally used in a piezoelectric element may be used. For example, metals such as Ti, Pt, Ta, Ir, Sr, In, Sn, Au, Al, Fe, Cr, and Ni and oxides of these metals may be used. As a composite oxide, an oxide of perovskite crystal such as $SrRuO_3$ or $LaNiO_3$ may be used. The lower electrode 2 and the upper electrode 4 may consist of one of these materials or may be obtained by laminating two or more of these materials.

The lower electrode 2 and the upper electrode 4 may be coated and calcined by a CSD method or the like or may be formed by sputtering, vapor deposition, or the like. Both the lower electrode 2 and the upper electrode 4 may be used by being patterned in desired shapes.

The piezoelectric film 3 in the present invention has a structure obtained by laminating the lead-free piezoelectric film 301 and the lead-containing piezoelectric film 302. A layer furthest from the substrate 1 and a layer closest to the substrate 1 constitute the lead-free piezoelectric film 301. In the present invention, the "lead-free piezoelectric thin film" means a thin film which is substantially free from a lead content and has piezoelectricity, and the "lead-containing piezoelectric thin film" means a thin film which includes a lead component and having piezoelectricity. When the piezoelectric film 3 has the above configuration, a synergistic effect between the lead-free piezoelectric film 301 and the lead-containing piezoelectric film 302 can be expected, and fatigue characteristics to continuous driving can be expected to be improved without considerably decreasing a magnitude of displacement of the piezoelectric film 3.

In the present invention, since a lead-free piezoelectric thin film is present at a position where a piezoelectric film is in contact with an electrode, lack of oxygen does not easily occur, and excellent resistance to fatigue can be achieved. For this reason, an advantage that resistance to fatigue in continuous driving is improved can be achieved. Since the degree of fatigue is determined by a weakest portion of the element, even though only one of the piezoelectric layers being in contact with the upper and lower electrodes is constituted by a lead-free piezoelectric thin film, fatigue near the opposite electrode becomes dominant, and the effect cannot be achieved. In contrast to this, when the layers near both the electrodes are constituted by lead-free piezoelectric thin films, energy levels (work functions) on electrode/piezoelectric boundaries are equal to each other on both the electrodes, so that resistance to fatigue of domain inversion may be improved.

The number of lamination layers of the lead-free piezoelectric film 301 and the lead-containing piezoelectric film 302 constituting the piezoelectric film 3 is preferably set at three or more, and is not limited to a specific number. However, when the number of lamination layers is excessively large, it is supposed that the film thickness of each lamination layer is excessively small. When the film thickness is excessively small, for example, in a piezoelectric thin film having a thickness of less than 10 nm, piezoelectric capability may be considerably deteriorated. Therefore, the film thickness of the lead-free piezoelectric film 301 or the lead-containing piezoelectric film 302 is preferably set at 10 nm or more, more preferably set at 100 nm or more.

When a plurality of lead-free piezoelectric films 301 to constitute the piezoelectric film 3 are used, the lead-free piezoelectric films 301 may have the same compositions or different compositions. When a plurality of lead-containing piezoelectric films 302 to constitute the piezoelectric film 3 are used, the lead-containing piezoelectric films 302 may have the same compositions or different compositions. However, the plurality of lead-free piezoelectric films preferably consist of the same material.

As described above, in the present invention, the lead-free piezoelectric film 301 is located on an uppermost surface of the piezoelectric film 3 when viewed from the substrate 1. When the lead-free piezoelectric film 301 is located on the uppermost surface of the piezoelectric film 3, a part where the piezoelectric film 3 is in contact with an external circuit, for example, the upper electrode 4 is constituted by the lead-free piezoelectric film 301. For this reason, fatigue characteristics to continuous driving of the piezoelectric film 3 are improved. As in the embodiment shown in FIG. 1, when the upper portion of the lead-containing piezoelectric film 302 is covered with the lead-free piezoelectric film 301, a lead component from the lead-containing piezoelectric film 302 to the upper electrode 4 can be prevented from being exuded when the piezoelectric element is driven.

As described above, in the present invention, the layer closest to the substrate 1 of the piezoelectric film 3 is constituted by the lead-free piezoelectric film 301. When the layer closest to the substrate 1 of the piezoelectric film 3 is constituted by the lead-free piezoelectric film 301, a part where the piezoelectric film 3 is in contact with the external circuit, for example, the lower electrode 2 is constituted by the lead-free piezoelectric film 301. For this reason, fatigue characteristics to continuous driving of the piezoelectric film 3 are improved. As in the embodiment shown in FIG. 1, when the lower portion of the lead-containing piezoelectric film 302 is covered with the lead-free piezoelectric film 301, a lead component from the lead-containing piezoelectric film 302 to the lower electrode 2 can be prevented from being exuded when the piezoelectric element is driven.

In the present invention, a volume fraction of the lead-containing piezoelectric film 302 to the piezoelectric film 3 constituted by a lamination layer of the lead-free piezoelectric film 301 and the lead-containing piezoelectric film 302 is preferably 20 or more and less than 90%. When the volume fraction of the lead-containing piezoelectric film 302 to the piezoelectric film 3 is set at 20% or more, the piezoelectric film 3 has a sufficient electromechanical transducing function. When the volume fraction of the lead-containing piezoelectric film 302 to the piezoelectric film 3 is set at less than 90%, a synergistic effect between the lead-containing piezoelectric film 302 and the lead-free piezoelectric film 301 becomes large, and the fatigue characteristics are sufficiently improved.

In the present invention, the film thickness of the piezoelectric film 3 preferably ranges from 1 μm to 5 μm. When the film thickness of the piezoelectric film 3 is set at 1 μm or more, a sufficient electromechanical transducing function can be obtained as that of a piezoelectric element. When the film thickness is set at 5 μm or less, a high integration density of the piezoelectric element can be expected.

In the present invention, the lead-containing piezoelectric film 302 is preferably a perovskite crystal piezoelectric thin film (to be referred to as a PLZT film hereinafter) expressed by the following general formula (1):

$$Pb_{(1-x)}La_x(Zr_yTi_{1-y})O_3 \quad (1)$$

(where x is a real number which satisfies a relation given by $0 \leq x < 1$, and y is a real number which satisfies a relation given by $0.05 \leq y \leq 1$). The lead-containing piezoelectric film 302 is preferably a PLZT film which satisfies the above general formula (where x satisfies a relation given by $0 \leq x < 0.2$, and y satisfies a relation given by $0.3 \leq y \leq 0.7$). A component x of La in the composition of Pb and La is set within the above range, and a component y of Zr in the composition of Zr and T is set within the above range, so that a piezoelectric film having high piezoelectricity can be obtained.

The PLZT film may be doped with a small amount of element except for Pb, La, Zr, and Ti. Concrete examples of an element which can be used as a dopant in doping include Ca, Sr, Ba, Sn, Th, Y, Sm, Ce, Bi, Sb, Nb, Ta, W, Mo, Cr, Co, Ni, Fe, Cu, Si, Ge, Sc, Mg, Mn, or the like. An amount of dopant is preferably set at an atomic fraction of 0.05 or less to a total number of metal atoms (which is 2) in the general formula (1).

A method of manufacturing a PLZT film is not limited to a specific method. For example, a CSD method, a sputtering method, a hydrothermal synthesis method, an aerosol deposition method, an MOCVD method, and the like are given.

For example, when the CSD method is selected, a compound containing metal components, i.e., Pb, La, Zr, and Ti, if desired, an additive such as a compound containing the dopant is mixed with a solvent. The mixture is hydrolyzed by being added with water to obtain a coating fluid. The coating fluid is coated on the substrate and heated to form an oxide film. The oxide film is calcined at a temperature higher than a crystallization temperature, so that a PLZT film having piezoelectricity can be obtained.

In general, a lead compound is highly-volatile, lack of lead may occur due to evaporation in the calcining step. For this reason, anticipating the lack, lead may be slightly excessively contained in a coating fluid by, for example, 2 to 40 mol %. As a result, even though a lead content in the calcined PLZT film is excessive, piezoelectric capability is not adversely affected. The degree of lack of lead varies depending on types of lead compounds and film forming conditions and can be calculated by an experiment.

In the present invention, the lead-free piezoelectric film 301 is preferably a bismuth-based layer-structured perovskite crystal piezoelectric thin film expressed by the following general formula (2).

$$(Bi_2O_2)^{2+}(A_{m-1}B_mO_{3m+1})^{2+} \quad (2)$$

(where A is one selected from Bi, Ba, Sr, Ca, Na, and K or a combination of elements having an arbitrary ratio, B is one selected from Ti, Nb, Ta, W, Mo, Fe, Co, and Cr or a combination of elements having an arbitrary ratio, and m is a natural number ranging from 1 to 5). When the bismuth-based layer-structured perovskite crystal is used in the lead-free piezoelectric film 301, it can be expected that fatigue characteristics in continuous driving of the piezoelectric film 3 is remarkably improved.

In order to make the piezoelectricity and the fatigue characteristics compatible, A in the general formula (2) preferably contains Bi as a main component, and B preferably contains Ti as a main component. In particular, the lead-free piezoelectric film 301 in the present invention preferably contains a $CaBi_4Ti_4O_{15}$ crystal (to be referred to as a CBT crystal hereinafter) as a main component.

A method of manufacturing a lead-free piezoelectric thin film containing a CBT crystal as a main component is not limited to a specific method. However, the thin film can be easily formed by the CSD method. In this case, a compound containing metal components of at least Ca, Bi, and Ti, if desired, a compound containing another metal component are mixed with a solvent to obtain a coating fluid. The coating fluid is coated on a substrate and heated to form an oxide film. The oxide film is calcined at a temperature higher than a crystallization temperature, so that a lead-free piezoelectric thin film containing the CBT crystal as a main component can be obtained.

The piezoelectric element according to the present invention preferably has a layer (may be expressed as a mixture layer) in which a material constituting a lead-containing piezoelectric thin film and a material constituting a lead-free piezoelectric thin film are mixed with each other on a boundary portion between a layer constituted by a lead-containing piezoelectric thin film and a layer constituted by a lead-free piezoelectric thin film. When the layer constituted by the lead-containing piezoelectric thin film and the layer constituted by the lead-free piezoelectric thin film have the layer in which materials constituting these layers are mixed, adhesivity and matching between these layers on the boundary are improved. For this reason, loss of a displacement amount can be minimized.

The method of forming a mixture layer on a boundary portion between a layer constituted by a lead-containing piezoelectric thin film and a layer constituted by a lead-free piezoelectric thin film is not limited to a specific method. For example, when the CSD method is used, in a transition portion from one of the lead-containing piezoelectric thin film and the lead-free piezoelectric thin film to the other, a precursor layer of one of metal oxides and a precursor layer of the other of the metal oxides are layered, and these layers are calcined at once to make it possible to form a mixture layer. Alternatively, a layer including both the precursors is formed and calcined to make it possible to form a mixture layer.

A piezoelectric actuator according to the present invention will be described below.

Figure 2A:
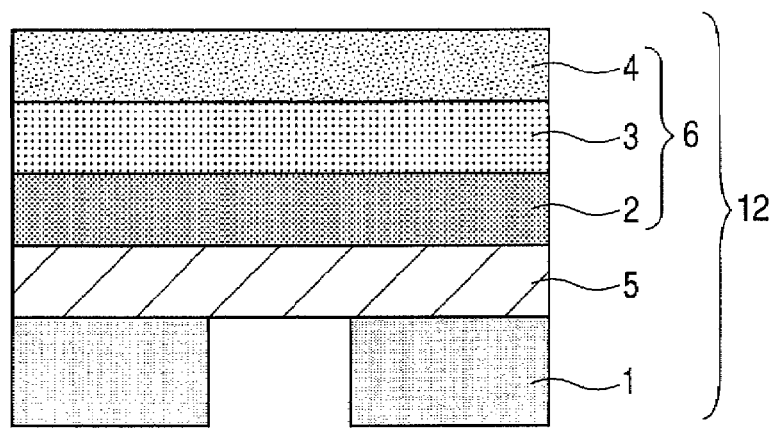
FIGS. 2A and 2B are a vertically sectional view and a back view showing an example of an embodiment of a piezoelectric actuator using the piezoelectric element according to the present invention.
Figure 2B:
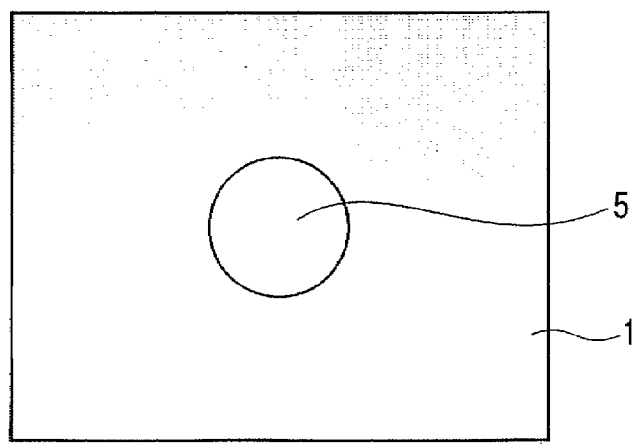

FIGS. 2A and 2B are vertical sectional view (FIG. 2A) and a back view (FIG. 2B) of an example of an embodiment of a piezoelectric actuator according to the present invention having the piezoelectric element according to the present invention and a vibration plate arranged in contact with the piezoelectric element. In FIGS. 2A and 2B, reference numeral 1 denotes a substrate; 2, a lower electrode; 3, a piezoelectric film; 4, an upper electrode; and 5, a vibration plate. In the structures in FIGS. 2A and 2B, the vibration plate 5 is in tight contact with the lower electrode 2 of the piezoelectric element. A material constituting the vibration plate 5 is not limited to a specific material, and various metal materials, metal oxide materials, or the like are used. Although not shown, the piezoelectric film 3 employs a laminate structure constituted by a lead-free piezoelectric thin film and a lead-containing piezoelectric thin film.

A method of manufacturing the vibration plate 5 is not limited to a specific method. For example, the substrate 1 may be subjected to an oxidizing process to perform surface modification, or the vibration plate 5 may be formed to be stuck to the substrate 1. The vibration plate 5 may be formed by a CSD method, a sputtering method, a hydrothermal synthesis method, an aerosol deposition method, an MOCVD method, and the like. A surface layer portion of the substrate 1 may serve as the vibration plate 5.

When a voltage is applied across the lower electrode 2 and the upper electrode 4, the piezoelectric film 3 is transformed by a piezoelectric effect. This transformation is amplified by the effect of the vibration plate 5 which is in tight contact with the piezoelectric element. As a result, the piezoelectric actuator varies at a bored portion of the substrate 1, and displacement amount can be easily controlled.

An ink jet recording head according to the present invention will be described below.

The ink jet recording head according to the present invention has an ink orifice, a pressure chamber communicating with the ink orifice, a vibration plate arranged in correspondence with the pressure chamber, and a piezoelectric element arranged in correspondence with the vibration plate. By a change in volume in the pressure chamber caused by the piezoelectric element, ink in the pressure chamber is discharged from the ink orifice. The ink jet recording head according to the present invention is characterized in that the piezoelectric element is the piezoelectric element according to the present invention.

Figure 3:
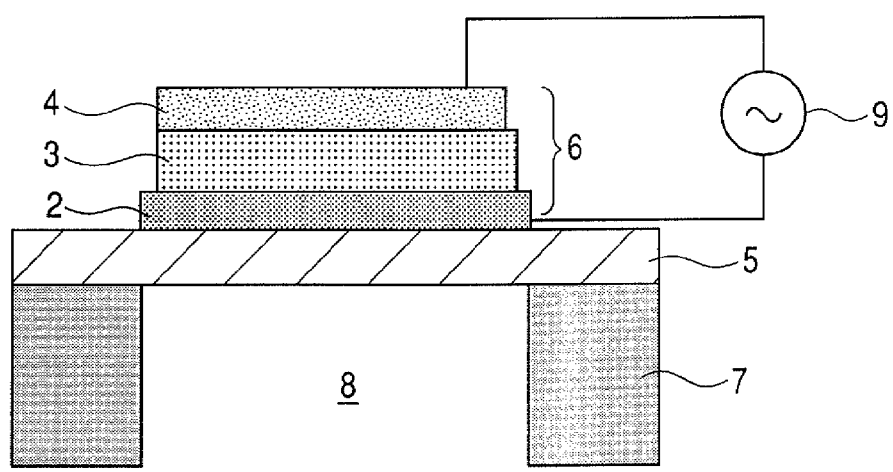
FIG. 3 is a vertically sectional view showing an enlarged part of an ink jet recording head in which the piezoelectric element according to the present invention is used as a piezoelectric actuator.

FIG. 3 shows a partially enlarged part of a vertical section of an example of the ink jet recording head which uses the piezoelectric element according to the present invention as a piezoelectric actuator. The configuration of the ink jet recording head is the same as that of a conventional ink jet recording head. The ink jet recording head is constituted by the piezoelectric actuator according to the present invention constituted by a head base 7, a vibration plate 5, a piezoelectric element 6, and a power source 9. The piezoelectric element 6 has a structure in which the piezoelectric film 3 is held between the lower electrode 2 and the upper electrode 4.

On the head base 7, a number of ink orifices (nozzles) (not shown) which discharge ink, a number of ink paths (not shown) communicating with the ink nozzles, respectively, and ink chambers 8 serving as a number of pressure chambers communicating with the ink paths, respectively. The vibration plate 5 is fixed to cover the entire upper surface of the head base 7. Upper openings of all the ink chambers 8 of the head base 7 are closed by the vibration plate 5. On the vibration plate 5, the piezoelectric element 6 to give vibration drive force to the vibration plate 5 is formed at a position corresponding to each of the ink chambers 8. The power source 9 of the piezoelectric actuator applies a voltage to a desired, selected piezoelectric element 6 to transform the piezoelectric element 6, thereby vibrating the vibration plate 5 at the corresponding position. In this manner, the volume in the ink chamber 8 of a part corresponding to vibration of the vibration plate 5 changes to push ink out of the ink nozzle through the corresponding ink path, so that printing is performed.

EXAMPLES

The present invention will be described below in detail. The present invention is not limited to the following examples.

(Manufacturing of Lead-Containing Coating Film)

As a coating fluid to form a lead-containing piezoelectric thin film, a source fluid having a metal composition (mole ratio) given by Pb/La/Zr/Ti=1.15/0.01/0.52/0.48 was manufactured as follows.

As a compound of Pb and La, lead acetate hydrate (1.15 mol) and lanthanum acetate hydrate (0.01 mol) were mixed with each other and heated to be dehydrated. The resultant compound, 1,8-diazabicyclo[5.4.0]-7-undec-7-ene serving as a stabilizing agent, and 1-methoxy-2-propanol (10 mol) serving as a solvent were mixed with each other, heated, and stirred. Thereafter, as a compound of Zr and Ti, tetra-n-butoxy zirconium (0.52 mol) and titanium tetra-isopropoxide (0.48 mol) were added to the resultant compound and further heated and reacted to each other to complex the source metal compounds with each other. Water (4.5 mol) and ethanol (5.0 mol) were added to the resultant complex to perform hydrolysis reaction. At this time, acetic acid (4.0 mol) and acetylacetone (0.7 mol) were added to the complex. Thereafter, a solvent having a boiling point of 100° C. or less was completely removed by a rotary evaporator. Diethylene glycol monoethylether was added to adjust a metal oxide converted concentration to 23 wt % to prepare a lead-containing coating fluid PB.

(Manufacturing of Lead-Free Coating Fluid)

As a coating fluid to form a lead-free piezoelectric thin film, a source fluid having a metal composition (mole ratio) of Ca/Bi/Ti=1/4/4 was manufactured as follows.

As a compound of Bi and Ti, tri-ethoxy bismuth (0.4 mol) and titanium tetra-isopropoxide (0.4 mol) were dissolved in 2-methoxy ethanol (4.0 mol), heated, and stirred. As a compound of Ca, a solution obtained by dissolving and refluxing metal Ca (0.1 mol) in ethanol (1.0 mol) was mixed with the resultant compound and heated and stirred to complex the source metal compounds with each other. Water (2.0 mol) and ethanol (3.0 mol) were added to the resultant complex to perform hydrolysis reaction. At this time, acetic acid (2.0 mol) and acetylacetone (0.3 mol) were added to the complex. Thereafter, a solvent having a boiling point of 100° C. or less was completely removed by a rotary evaporator. 2-methoxyethanol was added to adjust a metal oxide converted concentration to 10 wt % to prepare a lead-free coating fluid CB.

First Example (Manufacturing of Piezoelectric Element)

By using the source fluid manufactured as described above, a laminate piezoelectric film obtained by holding a lead-containing piezoelectric thin film between lead-free piezoelectric thin films was formed on a surface of a platinum layer of a multilayer substrate constituted by Pt/Ti/SiO$_2$/Si films.

The lead-free coating fluid CB was spin-coated (2000 rpm) on the platinum layer of the multilayer substrate and dried (400° C.). After the coating and drying steps were repeated three times in all, the multilayer substrate was calcined at 650° C. for 10 minutes in an electric furnace to form a first lead-free piezoelectric thin film. This first lead-free piezoelectric thin film had a film thickness of 0.40 μm.

The lead-containing coating fluid PB was spin-coated (3000 rpm) on the first lead-free piezoelectric thin film and dried (300° C.). The dried film was calcined at 650° C. for 10 minutes in an electric furnace to form a second lead-containing piezoelectric thin film. The second lead-containing piezoelectric thin film had a film thickness of 0.21 μm.

Subsequently, the lead-free coating fluid CB was spin-coated (2000 rpm) on the second lead-containing piezoelectric thin film and dried (400° C.). After the coating and drying steps were repeated three times in all, the multilayer substrate was calcined at 700° C. for 30 minutes in an electric furnace to form a third lead-free piezoelectric thin film. This laminate piezoelectric film had a film thickness of 1.02 μm, and the lead-containing piezoelectric thin film had a volume fraction of 21%. According to X-ray diffraction measurement of the piezoelectric film, peaks corresponding to a PLZT crystal and a CaBi$_4$Ti$_4$O$_{15}$ crystal were observed.

A gold thin film layer was formed on the upper portion of the piezoelectric film by a sputtering method to obtain a piezoelectric element A1 according to the present invention. The gold layer of the piezoelectric element is used as the upper electrode, and the platinum layer of the multilayer substrate is used as the lower electrode. By using an impedance/gain phase analyzer SI1260 (available from Solartron Analytical; tradename), a permittivity of the piezoelectric element A1 was measured. As a result, the piezoelectric element A1 had a relative permittivity of 1000 or more in a frequency range from 10 Hz to 10 kHz. By using a hysteresis measuring device HVS-6000 (available from Radiant Detector Technologies, LLC; tradename), hysteresis measurement was performed. As a result, such a hysteresis curve unique to a ferroelectric substance that spontaneous polarization is inverted by changing the polar character of the magnitude of an external electric field was observed, and a residual polarization value +Pr exhibited 14 μC/cm$^2$ after application of a 15-V voltage.

Second Example (Manufacturing of Piezoelectric Element)

By the same method as described in the first example, a piezoelectric film obtained by repeatedly alternately laminating lead-free piezoelectric thin films and lead-containing piezoelectric thin films was formed on a surface of the platinum layer of the multilayer substrate.

As in the first example, a lead-free piezoelectric thin film having a thickness of 0.4 μm was formed as a first layer on the platinum layer of the multilayer substrate. As in the first example, a lead-containing piezoelectric thin film having a thickness of 0.2 μm was formed as a second layer. Similarly, a lead-free piezoelectric thin film serving as a third layer and a lead-containing piezoelectric thin film serving as a fourth layer were repeatedly alternately formed. As a final coating layer, a lead-free coating fluid CB was spin-coated (2000 rpm) on a fourteenth lead-containing piezoelectric thin film and dried (400° C.). The entire laminate film was calcined at 700° C. for 30 minutes in an electric furnace to form a fifteenth lead-free piezoelectric thin film. The laminate piezoelectric film had a thickness of 4.6 μm. The lead-containing piezoelectric thin film had a volume fraction of 30%. According to X-ray diffraction measurement of the piezoelectric film, peaks corresponding to a PLZT crystal and a CaBi$_4$Ti$_4$O$_{15}$ crystal were observed.

As in the first example, a piezoelectric element B1 was manufactured. As in the first example, a permittivity and a hysteresis were measured. The piezoelectric element B1 had a relative permittivity of 1000 or more in a frequency range from 10 Hz to 10 kHz. According to hysteresis measurement, a hysteresis curve unique to a ferroelectric substance was observed, and a residual polarization value +Pr exhibited 18 μC/cm$^2$ after application of a 20-V voltage.

Third Example (Manufacturing of Piezoelectric Element)

By the following method, a piezoelectric film having a mixture layer containing a material constituting a lead-containing piezoelectric thin film and a material constituting a lead-free piezoelectric thin film on a boundary portion between a layer constituted by the lead-containing piezoelectric thin film and a layer constituted by the lead-free piezoelectric thin film was formed.

The lead-free coating fluid CB was spin-coated (2000 rpm) on the platinum layer of the multilayer substrate and dried (400° C.). The coating and drying steps were repeated three times in all to form a first uncalcined lead-free piezoelectric thin film precursor. The lead-containing coating fluid PB was spin-coated (3000 rpm) on the piezoelectric thin film precursor and dried (300° C.) to form a second lead-containing piezoelectric thin film precursor. Subsequently, the lead-free coating fluid CB was spin-coated (2000 rpm) on the second piezoelectric thin film precursor and dried (400° C.). After the coating and drying steps were repeated three times in all, the entire laminated layer of the piezoelectric thin film precursor was calcined at 700° C. for 30 minutes in an electric furnace. This laminate piezoelectric film had a film thickness of 1.05 μm. According to X-ray diffraction measurement of the piezoelectric film, peaks corresponding to a PLZT crystal and a CaBi$_4$Ti$_4$O$_{15}$ crystal were observed.

As in the first example, a piezoelectric element C1 was manufactured. As in the first example, a permittivity and a hysteresis were measured. The piezoelectric element C1 had a relative permittivity of 1000 or more in a frequency range from 10 Hz to 10 kHz. According to hysteresis measurement, a hysteresis curve unique to a ferroelectric substance was observed, and a residual polarization value+Pr exhibited 19 μC/cm$^2$ after application of a 20-V voltage.

A section extending from the upper electrode of the piezoelectric element C1 to the substrate was observed by a transmission electron microscope (to be expressed as a TEM). According to this observation, from the thickness of an image, such a condition that dense and thin regions of the lead-containing material were layered was found. However, a boundary line between the regions cannot be discriminated. In the boundary region, it was found that the material constituting the lead-containing piezoelectric thin film and the material constituting the lead-free piezoelectric thin film were mixed with each other.

Fourth Example (Manufacturing of Piezoelectric Actuator)

Figure 4:
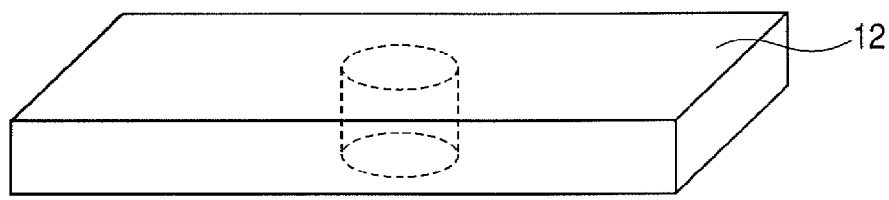
FIG. 4 is a perspective view typically showing an enlarged part of an example of piezoelectric actuators manufactured in fourth, fifth, and sixth embodiments.
Figure 5:
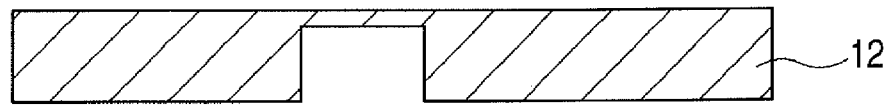
FIG. 5 is a vertically sectional view typically showing an enlarged part of an example of the piezoelectric actuator manufactured in the fourth, fifth, and sixth embodiments.

An Si portion of the piezoelectric element A1 according to the present invention obtained in the first example was partially etched from the rear surface to manufacture a piezoelectric actuator A2 having the structure shown in FIG. 2 (in FIGS. 4 and 5, a typical configuration is shown as a piezoelectric actuator 12). The etching of the Si layer was performed in a 22% aqueous solution of tetramethyl-ammonium hydroxide which was heated and stirred. The layer of the laminate piezoelectric film and the Pt/Ti/SiO$_2$ layer of the multilayer substrate were left in a bored portion of the Si layer formed by the etching. An SiO$_2$ layer having a film thickness of about 3 μm functions as the vibration plate 5.

An AC 10-V voltage was applied to the electrodes of the resultant piezoelectric actuator A2, and an amplitude of a vibration plate was detected by a laser-doppler speed meter. In this case, it was confirmed that the vibration plate was displaced in a frequency range of 1 to 10 kHz.

Fifth and Sixth Examples (Manufacturing of Piezoelectric Actuator)

Piezoelectric actuators B2 and C2 according to the present invention were manufactured by the same method as that in the fourth example except that the piezoelectric elements B1 and C1 obtained in the second and third examples were used. In either piezoelectric actuator, it was confirmed that the vibration plate was displaced by applying the voltage to the actuator.

First Comparative Example (Manufacturing of Comparative Piezoelectric Actuator)

For comparison with the present invention, a piezoelectric film obtained by laminating only a lead-containing piezoelectric thin film on a surface of a platinum layer of a multilayer substrate constituted by the same Pt/Ti/SiO$_2$/Si films as those used in the first example. By using the piezoelectric film, a piezoelectric actuator was manufactured.

The lead-containing coating fluid PB was spin-coated (2000 rpm) on the platinum layer of the multilayer substrate. The coating layer was heated and dried at 300° C. for 10 minutes by a hot plate. After the coating and drying steps were repeated four times in all, the multilayer substrate was calcined at 700° C. for 30 minutes in an electric furnace to form a layered structure (lead-containing piezoelectric film) of lead-containing piezoelectric thin films. The lead-containing piezoelectric film had a film thickness of 1.13 μm. According to X-ray diffraction measurement of the lead-containing piezoelectric film, a peak corresponding to a perovskite crystal of PLZT was observed.

A gold thin film was formed on the upper portion of the lead-containing piezoelectric film by a sputtering method to obtain a piezoelectric element P1. An Si portion of the obtained piezoelectric element P1 was partially etched from the rear surface by the same method as that in the fourth example to manufacture a piezoelectric actuator P2 for comparison.

Second Comparative Example (Manufacturing of Comparative Piezoelectric Actuator)

For comparison with the present invention, a piezoelectric film obtained by laminating only a lead-free piezoelectric thin film on a surface of a platinum layer of a multilayer substrate constituted by the same Pt/Ti/SiO$_2$/Si films as those used in the first example. By using the piezoelectric film, a piezoelectric actuator was manufactured.

The lead-free coating fluid CB was spin-coated (2000 rpm) on the platinum layer of the multilayer substrate and dried (400° C.). After coating and drying steps were repeated eight times in all, the multilayer substrate was calcined at 700° C. for 30 minutes in an electric furnace to form a layered structure (lead-free piezoelectric film) of lead-free piezoelectric thin films. The lead-free piezoelectric film had a film thickness of 1.06 μm. According to X-ray diffraction measurement of the lead-free piezoelectric film, a peak corresponding to a bismuth-based layer-structured perovskite crystal of $CaBi_4Ti_4O_{15}$ was observed.

A gold thin film was formed on the upper portion of the lead-free piezoelectric film by a sputtering method to obtain a piezoelectric element N1. An Si portion of the obtained piezoelectric element N1 was partially etched from the rear surface by the same method as that in the fourth example to manufacture a piezoelectric actuator N2 for comparison.

[Evaluating Method for Piezoelectric Actuator]

The piezoelectric actuators obtained in the fourth to sixth examples and the first and second comparative examples were comparatively evaluated. Alternating current (10 kHz, 10 V) was applied across the upper electrode and the lower electrode of each piezoelectric actuator, and displacement amount by piezoelectric vibration was measured by a laser-doppler method, and an initial value was compared with a displacement amount obtained after 720-hour operation. Results are shown in Table 1. As is apparent from Table 1, the piezoelectric actuators according to the present invention have large displacement amounts and operate well after 720-hour duration test.

On the other hand, the piezoelectric actuator P2 manufactured by using a piezoelectric film obtained by laminating only lead-containing piezoelectric thin films exhibited a large displacement amount at the beginning. However, performance after the 720-hour duration test was considerably deteriorated. In the piezoelectric actuator N2 manufactured by using a piezoelectric film obtained by laminating only lead-free piezoelectric thin films, a displacement amount itself was small at the beginning.

TABLE 1

|  | Name | Initial Displacement amount (μm) | Displacement amount after 720-hour Operation (μm) |
|---|---|---|---|
| Fourth Example | A2 | 1.1 | 1.1 |
| Fifth Example | B2 | 1.6 | 1.4 |
| Sixth Example | C2 | 1.7 | 1.6 |
| First Comparative Example | P2 | 1.5 | 0.6 |
| Second Comparative Example | N2 | 0.5 | 0.5 |

Seventh Example (Manufacturing of Ink Jet Recording Head)

Figure 6:
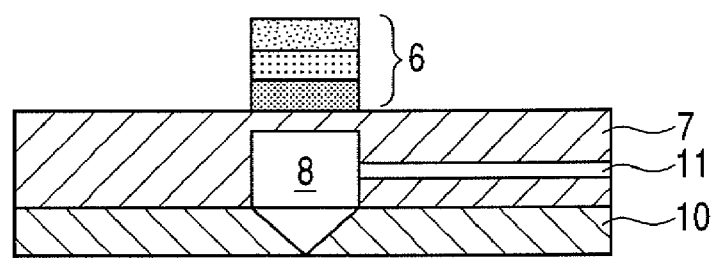
FIG. 6 is a vertically sectional view typically showing an enlarged part of an example of an ink jet recording head manufactured in a seventh embodiment.
Figure 7:
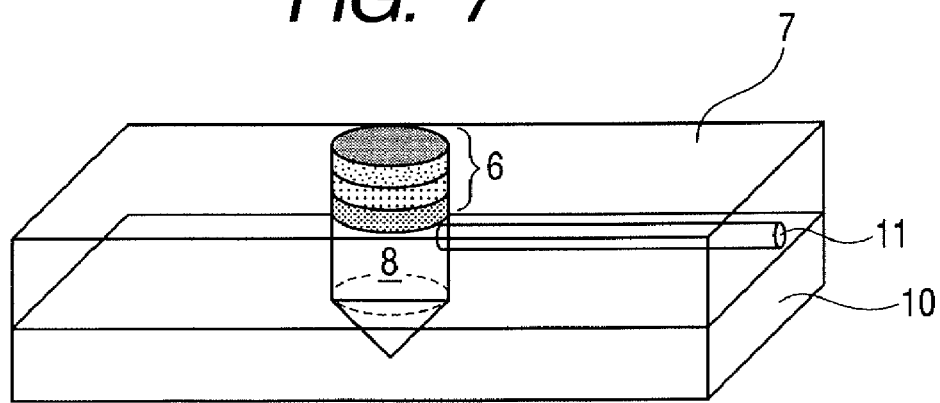
FIG. 7 is a perspective view typically showing an enlarged part of an example of the ink jet recording head manufactured in the seventh embodiment.

Nozzle plates 10 each having the configuration shown in FIGS. 6 and 7 were fixed to the piezoelectric actuators B2 and C2 obtained in the fifth and sixth examples, and ink feed pipes 11 to feed ink and head bases 7 were further fixed to manufacture ink jet recording heads B3 and C3. Discharge experiment was performed by using the ink jet recording heads.

Ink for ink jet was fed to the ink jet recording heads B3 and C3 by the ink feed pipe 11 to fill the ink chambers 8. An 10-V AC voltage having frequencies of 1 to 20 kHz was applied across the upper electrode and the lower electrode of each of the ink jet recording heads, and discharge manners of the ink were observed by a microscope. In this manner, it was confirmed that both the ink jet recording heads could discharge ink droplets while following the frequencies. Similarly, when ink jet recording heads B4 and C4 each having a plurality of ink orifices formed thereon were manufactured, it was confirmed that the ink was discharged in the same manner as described above. In this manner, it could be confirmed that the ink jet recording heads using the piezoelectric actuators according to the fifth and sixth examples had sufficient functions for an ink jet recording head and were suitable for long-time driving.

This application claims the benefit of Japanese Patent Application No. 2006-130295, filed May 9, 2006, which is hereby incorporated by reference herein in its entirety.

What is claimed is:

1. A piezoelectric element having a piezoelectric film and one pair of electrodes being in contact with
    the piezoelectric film on a substrate, wherein
    the piezoelectric film has a structure in which a lead-containing piezoelectric film and a lead-free piezoelectric film are layered, and
    in the piezoelectric film, a layer furthest from the substrate and a layer closest to the substrate are lead-free piezoelectric films.

2. The piezoelectric element according to claim 1, wherein in the piezoelectric film, the layer furthest from the substrate and the layer closest to the substrate consist of the same material.

3. The piezoelectric element according to claim 1, wherein a volume fraction occupied by the lead-containing piezoelectric film is 20% or more and less than 90% to a full volume of the piezoelectric film.

4. The piezoelectric element according to claim 1, wherein the piezoelectric film has a film thickness of 1 μm or more and 5 μm or less.

5. The piezoelectric element according to claim 1, wherein the lead-containing piezoelectric film is a perovskite crystal piezoelectric film expressed by the following general formula (1)
$Pb_{(1-x)}La_x(Zr_yTi_{1-y})O_3$ (1) (where x is a real number which satisfies a relation given by $0 \leq x < 1$, and y is a real number which satisfies a relation given by $0.05 \leq y \leq 1$).

6. The piezoelectric element according to claim 1, wherein the lead-free piezoelectric film is a piezoelectric film of a bismuth-based layer-structured perovskite crystal piezoelectric thin film expressed by the following general formula (2)
$(Bi_2O_2)^{2+}(A_{m-1}B_mO_{3m+1})^{2-}$ (2) (where A is one selected from Bi, Ba, Sr, Ca, Na, and K or a combination of elements having an arbitrary ratio, B is one selected from Ti, Nb, Ta, W, Mo, Fe, Co, and Cr or a combination of elements having an arbitrary ratio, and m is a natural number ranging from 1 to 5).

7. The piezoelectric element according to claim 6, wherein the lead-free piezoelectric film is a piezoelectric film containing a $CaBi_4Ti_4O_{15}$ crystal as a main component.

8. The piezoelectric element according to claim 1, wherein the piezoelectric film has a layer in which a material constituting the lead-containing piezoelectric thin film and a material constituting the lead-free piezoelectric thin film are mixed with each other on a boundary portion between a layer constituted by the lead-containing piezoelectric thin film and a layer constituted by the lead-free piezoelectric thin film.

9. A piezoelectric actuator comprising:
    the piezoelectric element according to claim 1; and a vibration plate arranged in contact with the piezoelectric element.

10. An ink jet recording head which has an ink orifice, a pressure chamber communicating with the ink orifice, a vibration plate arranged in correspondence with the pressure chamber, and a piezoelectric arranged in correspondence with the vibration plate, ink in the pressure chamber being discharged from the ink orifice by a change in volume in the pressure chamber caused by the piezoelectric element, wherein
    the piezoelectric element is the piezoelectric element according to claim 1.

* * * * *